United States Patent
Bongiovi

(10) Patent No.: US 7,274,795 B2
(45) Date of Patent: *Sep. 25, 2007

(54) SYSTEM FOR AND METHOD OF AUDIO SIGNAL PROCESSING FOR PRESENTATION IN A HIGH-NOISE ENVIRONMENT

(76) Inventor: Anthony Bongiovi, 649 Whitmore Dr., Port St. Lucie, FL (US) 37984

(*) Notice: Subject to any disclaimer, the term of this patent is extended or adjusted under 35 U.S.C. 154(b) by 127 days.

This patent is subject to a terminal disclaimer.

(21) Appl. No.: 10/922,107

(22) Filed: Aug. 20, 2004

(65) Prior Publication Data
US 2006/0034471 A1  Feb. 16, 2006

Related U.S. Application Data

(63) Continuation-in-part of application No. 10/914,234, filed on Aug. 10, 2004.

(51) Int. Cl.
*H03G 7/00* (2006.01)
(52) U.S. Cl. .............. 381/106; 381/103; 381/98; 381/107
(58) Field of Classification Search .......... 381/103, 381/102, 98, 104–108, 57; 333/14; 455/72
See application file for complete search history.

(56) References Cited

U.S. PATENT DOCUMENTS

| | | | |
|---|---|---|---|
| 4,162,462 A | * | 7/1979 | Endoh et al. ................ 333/14 |
| 4,353,035 A | * | 10/1982 | Schroder ................... 330/126 |
| 4,363,007 A | * | 12/1982 | Haramoto et al. ............ 333/14 |
| 4,538,297 A | * | 8/1985 | Waller, Jr. .................. 381/106 |
| 4,584,700 A | | 4/1986 | Scholz |
| 4,677,645 A | | 6/1987 | Kaniwa et al. |
| 4,704,726 A | | 11/1987 | Gibson |
| 4,739,514 A | | 4/1988 | Short et al. |
| 4,815,142 A | | 3/1989 | Imreh |
| 5,133,015 A | | 7/1992 | Scholz |
| 5,361,381 A | | 11/1994 | Short |
| 5,617,480 A | * | 4/1997 | Ballard et al. ................ 381/98 |
| 5,872,852 A | * | 2/1999 | Dougherty .................. 381/57 |
| 6,078,670 A | * | 6/2000 | Beyer ........................ 381/57 |

OTHER PUBLICATIONS

"NovaSound International Inc.", http://www.novasoundint.com/new_page_1.htm, 2004.

* cited by examiner

*Primary Examiner*—Vivian Chin
*Assistant Examiner*—Jason Kurr
(74) *Attorney, Agent, or Firm*—Sheppard Mullin Richter & Hampton LLP

(57) ABSTRACT

The present invention relates to novel systems, methods, and circuits useful for achieving quality sound presentation in high-noise environments. Specifically, the present invention provides systems, methods, and circuits for processing audio signals. The present invention further provides methods for hard-programming adjustments into a multi-band equalizer that compensates for anomalies associated with an anticipated listening environment.

22 Claims, 9 Drawing Sheets

US 7,274,795 B2

SYSTEM FOR AND METHOD OF AUDIO SIGNAL PROCESSING FOR PRESENTATION IN A HIGH-NOISE ENVIRONMENT

CROSS-REFERENCE TO RELATED APPLICATION

This application is a continuation-in-part, and claims the benefit under 35 U.S.C. § 120, of U.S. patent application Ser. No. 10/914,234, filed on Aug. 10, 2004, which is incorporated herein by reference in its entirety.

FIELD OF THE INVENTION

The present invention relates to novel systems, methods, and circuits useful for achieving quality sound presentation in high-noise environments. Specifically, the present invention provides systems, methods, and circuits for processing audio signals. The present invention further provides methods for hard-programming adjustments into a multi-band equalizer that compensates for anomalies associated with an anticipated listening environment.

BACKGROUND OF THE INVENTION

Achieving quality sound presentation in high-noise environments, such as moving vehicles, remains particularly challenging. For example, the bass response of a system in such an environment is generally inadequate. While the bass response may be boosted with an equalizer to compensate for this inadequacy, this approach typically causes a muffled treble response, thus diminishing the sound quality. In addition to a muffled treble, bass boosting may undesirably increase the dynamic range of the sound presentation. In a noisy environment, there is very little audio range between the volume floor set by the noise (typically around 80 dB in moving vehicles) and the volume ceiling set by the physiology of the ear (typically around 110 dB). Increasing the dynamic range of sound presented in a noisy environment may be aesthetically undesirable because the sound level may approach the ear's physiological volume ceiling, resulting in an unpleasant, annoying, or even painful response. Accordingly, a new approach is needed for quality audio presentation in a high-noise environment.

Typical consumer sound transducers, such as commercial speakers, are acoustically efficient between approximately 600 and 1,000 cycles. To compensate for the inefficient performance of such transducers outside this range, systems often employ a variety of special speakers and amplifiers that can be quite expensive. A system that compensates for this inefficient performance without the introduction of extra and often expensive hardware would be beneficial.

Today, the dynamic range of sound in motion pictures is created and mixed in an environment the size of a movie theater. Quality playback of motion picture audio in a small environment, such as a home entertainment area or an automobile, is difficult at best. In a small environment, audio standing waves often develop, producing an annoying acoustical signal at the frequency of the standing wave. Compensation for such specific standing waves in a given small environment would produce a higher quality audio presentation.

Finally, in contrast to the careful attention given to movie sounds and music, the audio in electronic video games are often mixed haphazardly. This haphazard mixing often does not present full, balanced audio to the listener. Enhancing the audio signal frequency wide across the full dynamic range will present higher quality audio.

SUMMARY OF THE INVENTION

The present invention relates to novel systems, methods, and circuits useful for achieving quality sound presentation in high-noise environments. In one aspect, the present invention provides systems for processing an audio signal. In one embodiment, the system may comprise a primary equalizer that produces an equalized audio signal by adjusting the amplitude of the low frequency portions of the audio signal corresponding to audible bass sounds and adjusting in the opposite direction the amplitude of the high frequency portions of the audio signal corresponding to audible treble sounds, wherein the adjusting and the adjusting in the opposite direction intersect between a crossover range of frequencies producing a substantially negligible gain in the crossover range; a compressor that produces a compressed audio signal by compressing the dynamic range of the audio signal; and a mirror equalizer that produces a substantially opposite effect as the primary equalizer.

In another embodiment, the system may comprise a primary equalizer that produces an equalized audio signal by decreasing the amplitude of the low frequency portions of the audio signal corresponding to audible bass sounds and increasing the amplitude of the high frequency portions of the audio signal corresponding to audible treble sounds, wherein the decreasing and the increasing intersect between a frequency range producing a substantially negligible gain in the range; a compressor that produces a compressed audio signal by compressing the dynamic range of the audio signal; and a mirror equalizer that produces a substantially opposite effect as the primary equalizer.

In an alternative embodiment, the system may comprise a primary equalizer that produces an equalized audio signal by adjusting the amplitude of the low frequency portions of the audio signal corresponding to audible bass sounds and adjusting in the opposite direction the amplitude of the high frequency portions of the audio signal corresponding to audible treble sounds, wherein the adjusting and the adjusting in the opposite direction intersect between a frequency range producing a substantially negligible gain in the range; a compressor that produces a compressed audio signal by compressing the dynamic range of the audio signal; a mirror equalizer that produces a substantially opposite effect as the primary equalizer; and a final equalizer that adjusts the amplitude of the signal at frequencies predetermined to be related to sound presentation anomalies associated with the anticipated listening environment.

In yet another embodiment, the system may comprise a primary equalizer that produces an equalized audio signal by decreasing the amplitude of the low frequency portions of the audio signal corresponding to audible bass sounds and increasing the amplitude of the high frequency portions of the audio signal corresponding to audible treble sounds, wherein the decreasing and the increasing intersect between a frequency range producing a substantially negligible gain in the range; a compressor that produces a compressed audio signal by compressing the dynamic range of the audio signal; a mirror equalizer that produces a substantially opposite effect as the primary equalizer; and a final equalizer that adjusts the amplitude of the signal at frequencies predetermined to be related to sound presentation anomalies associated with the anticipated listening environment.

The systems of the present invention may further comprise a speaker system responsive to the output signal of the mirror equalizer.

In one embodiment, the crossover range may be approximately 600 Hz to approximately 1,000 Hz. In another embodiment, the primary equalizer and the mirror equalizer may adjust amplitude according to a substantially linear function of frequency.

In one embodiment, the compressor may compress the audio signal by attenuating the high amplitude portions of the audio signal. Alternatively, the compressor may compress the audio signal by amplifying the low amplitude portions of the audio signal. In a specific embodiment, the compressor may compress the dynamic range of the audio signal to less than about 10 dB.

In another embodiment, the primary equalizer may use at least one filter to adjust the amplitude of the high frequency portions of the audio signal and the mirror equalizer may use at least one filter to produce a substantially opposite effect on the high frequency portions of the audio signal as the primary equalizer; wherein the filters may have a substantially equal and opposite effect on the audio signal.

Alternatively, the primary equalizer may use at least one filter to adjust the amplitude of the low frequency portions of the audio signal and the mirror equalizer may use at least one filter to produce a substantially opposite effect on the low frequency portions of the audio signal as the primary equalizer; wherein the filters may have an equal and opposite effect on the audio signal.

In one embodiment, the primary equalizer may decrease the amplitude of the low frequency portions of the signal by about 10 dB at 100 Hz. In another embodiment, the primary equalizer may increase the amplitude of the high frequency portions of the signal by about 8 dB at 8 kHz.

The primary equalizer may increase the amplitude of the low frequency portions of the signal by about 10 dB at 100 Hz. Alternatively, the primary equalizer may decrease the amplitude of the high frequency portions of the signal by about 8 dB at 8 kHz.

In yet another embodiment, the mirror equalizer may increase the amplitude of the low frequency portions of the signal by about 10 dB at 100 Hz. In a further embodiment, the mirror equalizer may decrease the amplitude of the high frequency portions of the signal by about 8 dB at 8 kHz.

In a further embodiment, the mirror equalizer may decrease the amplitude of the low frequency portions of the signal by about 10 dB at 100 Hz. Alternatively, the mirror equalizer may increase the amplitude of the high frequency portions of the signal by about 8 dB at 8 kHz.

In another aspect, the present invention provides methods for processing an audio signal. In one embodiment, the method may comprise primary equalizing the audio signal by adjusting the amplitude of the low frequency portions of the audio signal corresponding to audible bass sounds and adjusting in the opposite direction the amplitude of the high frequency portions of the audio signal corresponding to audible treble sounds, wherein the adjusting and the adjusting in the opposite direction intersect between a frequency range producing a substantially negligible gain in the range; compressing the dynamic range of the audio signal; and mirror equalizing the audio signal in a substantially opposite way as the primary equalizing.

In another embodiment, the method may comprise primary equalizing the audio signal by adjusting the amplitude of the low frequency portions of the audio signal corresponding to audible bass sounds and adjusting in the opposite direction the amplitude of the high frequency portions of the audio signal corresponding to audible treble sounds, wherein the adjusting and the adjusting in the opposite direction intersect between a frequency range producing a substantially negligible gain in the range; compressing the dynamic range of the audio signal; mirror equalizing the audio signal in a substantially opposite way as the primary equalizing; and adjusting the amplitude of the signal at frequencies predetermined to be related to sound presentation anomalies associated with the anticipated listening environment.

In another aspect, the present invention provides circuits for processing an audio signal. In one embodiment, the circuit may comprise a primary equalizer that produces an equalized audio signal by adjusting the amplitude of the low frequency portions of the audio signal corresponding to audible bass sounds and adjusting in the opposite direction the amplitude of the high frequency portions of the audio signal corresponding to audible treble sounds, wherein the adjusting and the adjusting in the opposite direction intersect between a frequency range producing a substantially negligible gain in the range; a compressor that produces a compressed audio signal by compressing the dynamic range of the audio signal; and a mirror equalizer that produces a substantially opposite effect as the primary equalizer.

In an alternative embodiment, the circuit may comprise a primary equalizer that produces an equalized audio signal by adjusting the amplitude of the low frequency portions of the audio signal corresponding to audible bass sounds and adjusting in the opposite direction the amplitude of the high frequency portions of the audio signal corresponding to audible treble sounds, wherein the adjusting and the adjusting in the opposite direction intersect between a frequency range producing a substantially negligible gain in the range; a compressor that produces a compressed audio signal by compressing the dynamic range of the audio signal; a mirror equalizer that produces a substantially opposite effect as the primary equalizer; and a final equalizer that adjusts the amplitude of the signal at frequencies predetermined to be related to sound presentation anomalies associated with the anticipated listening environment.

In yet another aspect, the present invention provides methods for hard-programming adjustments into at least one multi-band equalizer that compensates for anomalies associated with an anticipated listening environment. In one embodiment, the method may comprise presenting a test audio signal into the anticipated listening environment; detecting audio presentation anomalies associated with the anticipated listening environment from responses from the test audio signal; determining the frequency associated with the anomalies of the audio signal; adjusting the amplitude at the frequency to compensate for the anomalies in the multi-band equalizer; and hard-programming the adjustment at the frequency into at least one multi-band equalizer.

In an alternative embodiment, the method may comprise presenting a test audio signal into the anticipated listening environment, wherein the test audio signal is selected from the group consisting of broadband noise and frequency sweeps; detecting audio presentation anomalies associated with the anticipated listening environment from responses from the test audio signal, wherein the anomalies are detected with a device selected from the group consisting of a fast Fourier analyzer and a computer frequency analyzer; determining the frequency associated with the anomalies of the audio signal by analyzing the results of from the detecting device; adjusting the amplitude at the frequency with the multi-band equalizer to compensate for the anomalies; and hard-programming the adjustment at the frequency into the multi-band equalizer.

DETAILED DESCRIPTION OF THE PREFERRED EMBODIMENTS

It is to be understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. All references cited herein are incorporated by reference herein in their entirety.

The system, methods, and circuitry described herein are designed to accommodate the conversion of audio signals with a broad dynamic range to a narrow dynamic range without distorting or altering the original work and to compensate for environmental factors. This system is particularly suited for playing music, movies, or video games in high-noise environments such as an automobile, airplane, boat, club, theatre, amusement park, shopping center, etc. Furthermore, the system, methods, and circuitry of the present invention seek to improve sound presentation by processing an audio signal outside the efficiency range of both the human ear and audio transducers which is between approximately 600 Hz and approximately 1,000 Hz. By processing audio outside this range, a fuller and broader presentation may be obtained.

Figure 1:
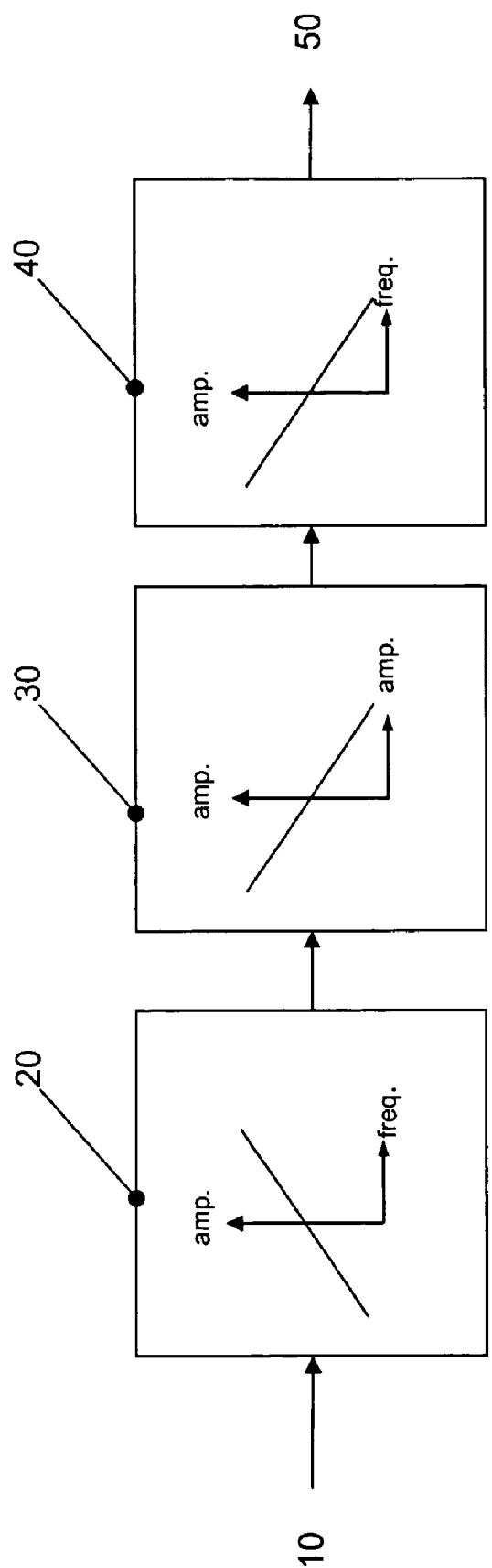
FIG. 1 is a schematic view of and example system in which the equalizer, compressor, and mirror equalizer are coupled together.

Referring to the figures, FIG. 1 is a schematic view of one embodiment of the present invention. The system comprises a primary equalizer 20, a compressor 30, and a mirror equalizer 40. A graphical representation of the functionality of each individual component is shown within the drawing of each. An audio input signal 10 is inputted into the primary equalizer 20 and an enhanced audio output signal 50 is produced from the mirror equalizer 40. The primary equalizer 20 in this embodiment receives an audio input signal 10, attenuates the amplitude of the portion of the signal corresponding to the bass spectrum of sound, and amplifies the amplitude of the signal corresponding to the treble spectrum of sound. For example, the low audible bass portion (around 100 Hz) may be decreased by about 10 dB, the high audible treble portion (around 8 kHz) may be increased by about 8 dB, and the portions in between are adjusted as a linear function of frequency. A variety of suitable equalizers are known in the art. One such analog equalizer is shown in block 11 of FIG. 3.

At some frequency between this high frequency amplification and low frequency attenuation the effects of the amplification and attenuation intersect at the crossover point. At this crossover point, the effect of these two processes on the audio signal exactly cancel each other out and produce a net gain of zero. Centered around this crossover point is a range of frequencies where these two processes substantially negate their effect on the audio signal. In one embodiment of the present invention, this range is between approximately 600 Hz and approximately 1,000 Hz. In this embodiment, the crossover range is specially designed to be within the efficiency range of standard sound transducers and the human ear. Other embodiments may shift this crossover point as necessitated by the specific application.

Referring again to FIG. 1, the primary equalizer 20 feeds the compressor 30. The compressor amplifies and attenuates the signal inversely proportional to the amplitude of the signal. That is, low amplitudes are provided high amplification (or low attenuation) while high amplitudes are provided high compression (or low amplification). This results in a lower dynamic range of the signal. The dynamic range of the signal, for example, may be lowered to as little as 10 dB or less. Furthermore, in another embodiment of the present invention, the compressor may attenuate the high amplitudes of an audio signal more than low amplitudes. In another embodiment the compressor may amplify low amplitudes of an audio signal more than high amplitudes. A variety of suitable compressors are known in the art. One embodiment of a compressor is shown in block 12 of FIG. 3.

Returning again to FIG. 1, after compression, the audio signal is fed into the mirror equalizer 40. This mirror equalizer 40 provides the opposite functionality as the primary equalizer 20. Here, in this specific embodiment, the mirror equalizer increases the amplitude of the portion of the signal corresponding to the bass spectrum of sound and decreases the amplitude of the signal corresponding to the treble spectrum of sound. This mirror equalizer 40 also has a crossover point that is substantially the same crossover point as the primary equalizer 20. For example, the low audible bass portion (around 100 Hz) may be increased by about 10 dB, the high audible treble portion (around 8 kHz) may be decreased by about 8 dB, and the portions in between are adjusted linearly as a function of frequency. The primary equalizer 10 and mirror equalizer 30 are ideally chosen to be complementary so that they have equal and opposite affects. One embodiment of a mirror equalizer is shown in block 13 of FIG. 3.

After primary equalization, compression, and mirror equalization, the processed audio signal may be applied directly to a speaker system, through a multi-band equalizer to a speaker system, or through an amplifier to a speaker system. Because the bass portion may be reduced before compression and enhanced after compression, the sound presented to the speakers has a spectrum rich in bass tones and free of the muffling effects encountered with conventional compression. Also, this embodiment produces a rich sound even from a small speaker system, for example, those having magnets less than 10 oz. Furthermore, because the dynamic range has been reduced by compression, the sound may be presented within a limited volume range. For example, this system may comfortably present quality sound in a high-noise environment with an 80 dB noise floor and a 110 dB sound threshold.

Figure 2:
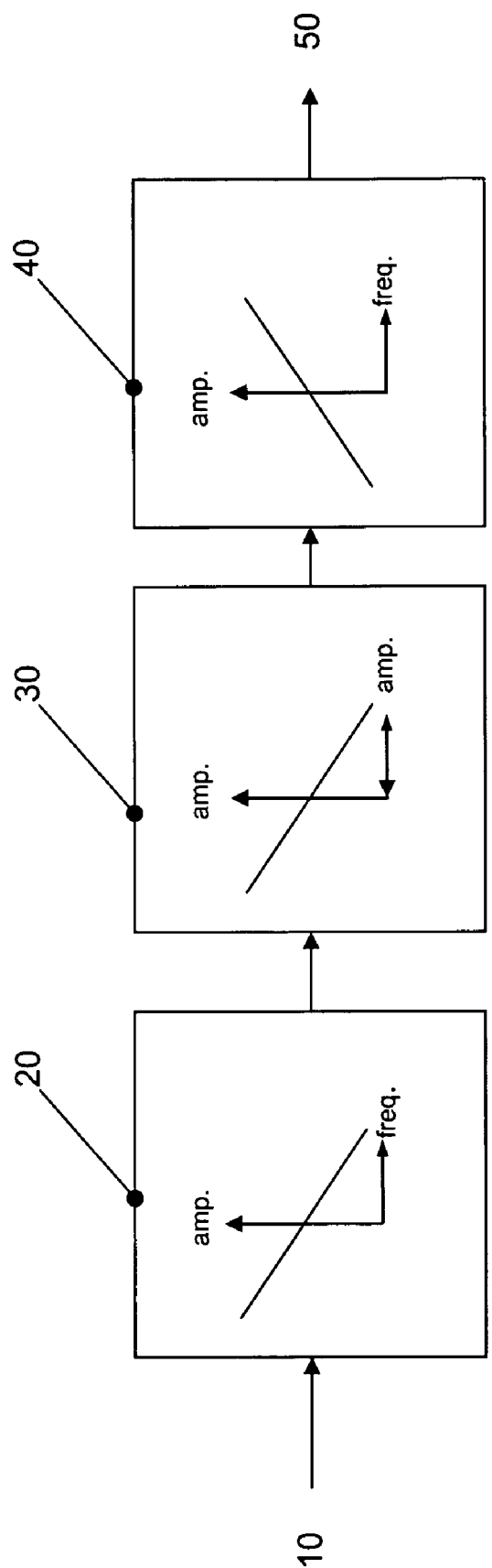
FIG. 2 is a schematic view of the equalizer, compressor, and mirror equalizer coupled together, where the equalizers amplify and attenuate opposite to those of FIG. 1.

FIG. 2 shows another embodiment of the present invention. This embodiment is similar to that embodiment shown in FIG. 1. In this embodiment, the primary equalizer 20 receives an audio input signal 10, amplifies the amplitude of the portion of the signal corresponding to the bass spectrum of sound, and attenuates the amplitude of the signal corresponding to the treble spectrum of sound. The embodiment of FIG. 2 amplifies the signal where the embodiment of FIG. 1 attenuates. Likewise, the embodiment of FIG. 2 attenuates the signal where the embodiment of FIG. 1 amplifies. The mirror equalizer in FIG. 4 also has the opposite functionality of the mirror equalizer in FIG. 1.

Figure 3:
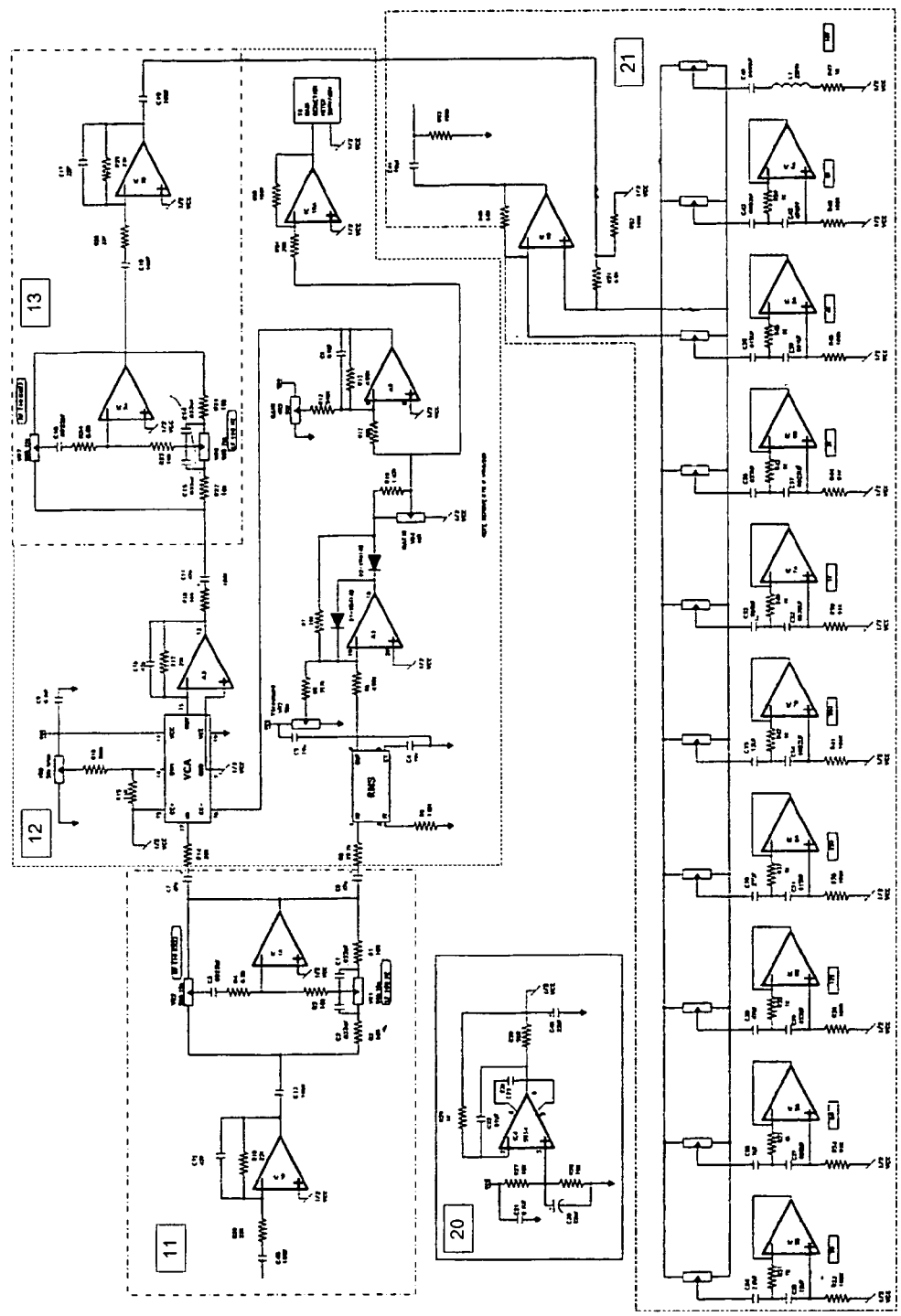
FIG. 3 is a detailed schematic of one example of one embodiment of the present invention.

FIG. 3 is a diagram of one specific embodiment of the present invention. This embodiment shows implemented with analog components. The equalizer is shown in block 11, the compressor in block 12, the mirror equalizer in block 13, an optional power supply is shown in block 20, and a 10 channel equalizer in block 21. All of the components shown are standard, commercially available components. Each individual module may be implemented with another reasonable substitute known in the art.

Figure 4:
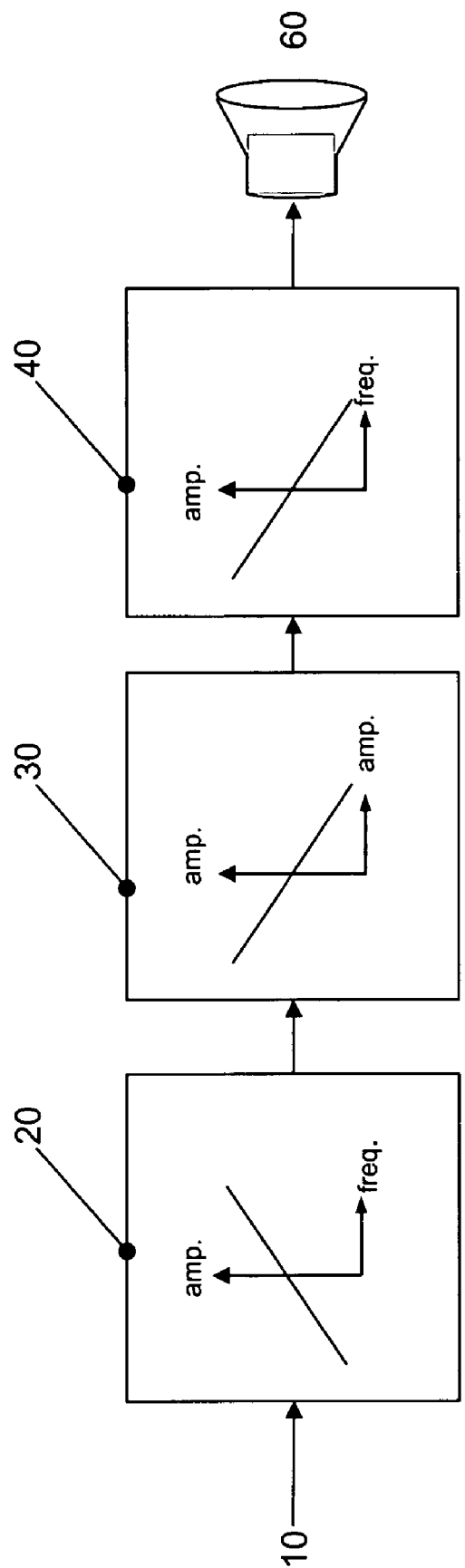
FIG. 4 is a schematic view of an equalizer, compressor, and mirror equalizer coupled with a speaker.

FIG. 4 represents another embodiment of the present invention. FIG. 4 shows the embodiment of FIG. 1 coupled with a speaker system 60.

Figure 5:
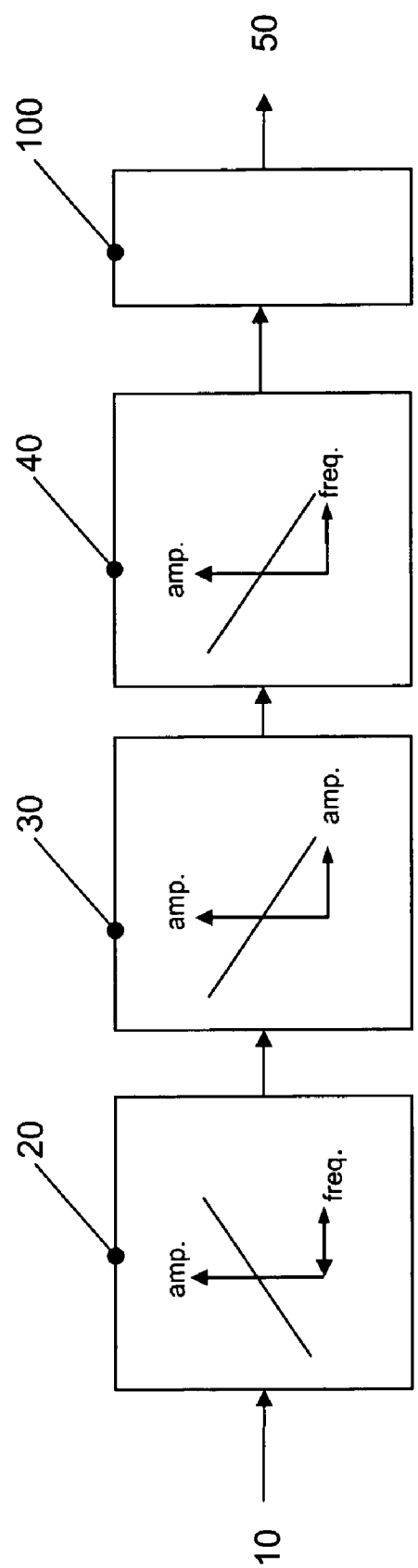
FIG. 5 is a schematic view of an equalizer, compressor, mirror equalizer and a multi-band equalizer sequentially coupled together.

FIG. 5 represents another embodiment of the present invention. In this embodiment a multi-phase equalizer 100 is coupled with a mirror equalizer 40 before the audio signal is output 50. In a further embodiment of the invention such a signal outputs from the multi-band equalizer 100 to a speaker system that is not shown in the drawings.

Figure 6:
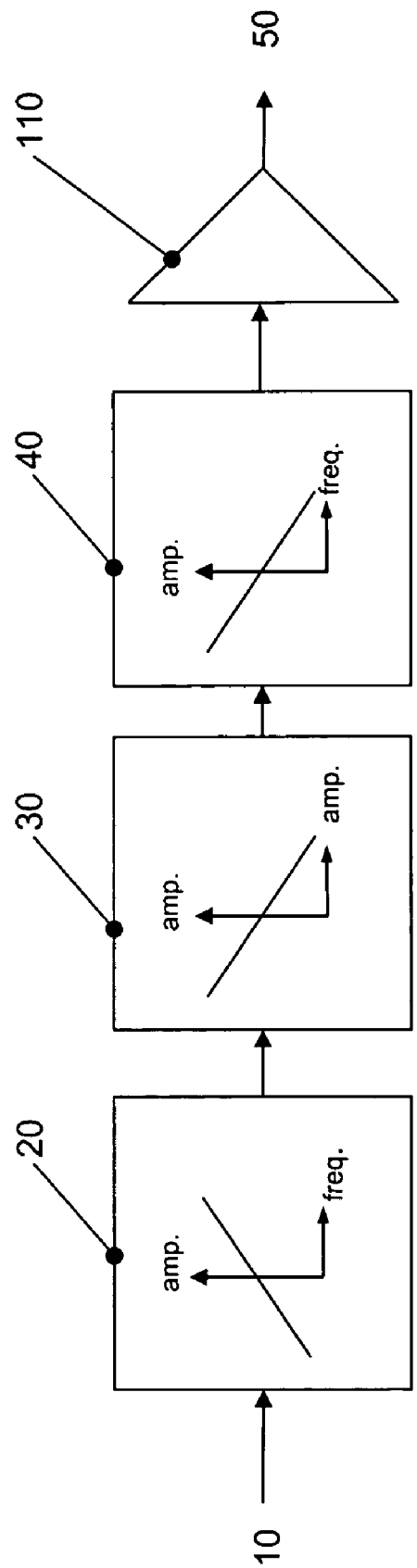
FIG. 6 is a schematic view of an equalizer, compressor, mirror equalizer and an amplifier sequentially coupled together.

FIG. 6 represents another embodiment of the present invention. In this embodiment an amplifier 110 is coupled to the mirror equalizer 40 prior to output 50. In a further embodiment of the invention such a signal outputs from the amplifier 110 to a speaker system that is not shown in the drawing.

Figure 7:
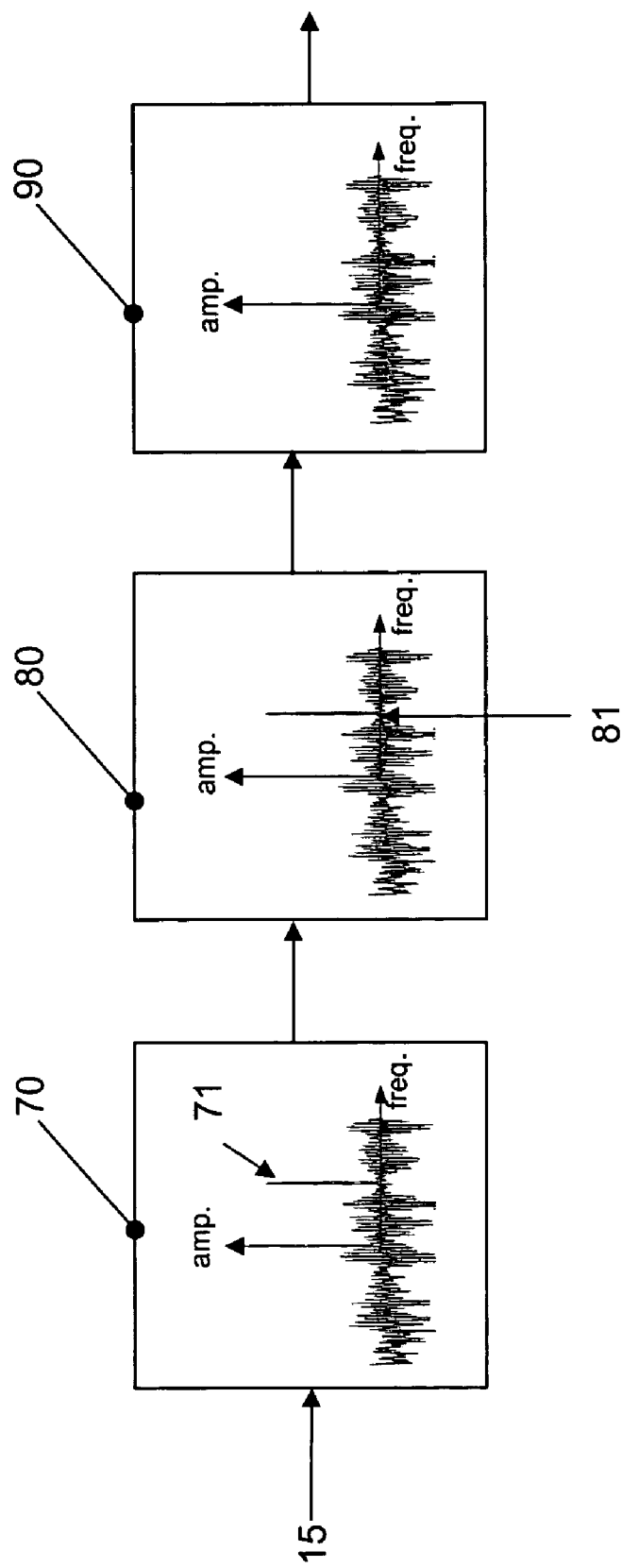
FIG. 7 is a schematic view of the process of detecting anomalies, determining the frequency where the anomaly occurs, and then adjusting amplitude at that frequency.

FIG. 7 represents another embodiment of the present invention. In FIG. 7, an audio presentation response 15 is introduced and anomalies in the audio presentation are detected by process 70. A graphical representation of such a signal with an audio anomaly is shown within the drawing of process 70. Note the extraordinarily large amplitude of the audio presentation at one frequency 71. Some signals may present multiple or no anomalies. For example, a particular listening environment may produce such anomalous audio responses such as those from standing waves. For example, such standing waves often occur in small listening environments such as an automobile. The length of an automobile, for example, is around 400 cycles long. In such an environment, some standing waves are set up at this frequency and some below. Standing waves present an amplified signal at their frequency which may present an annoying acoustic signal. FIG. 7, for simplicity, shows only one anomaly. Thus, the process 70 detects an anomalous presentation in a signal, such as a portion of a signal at a given frequency amplified due to a standing wave. Next, process 80 determines the frequency at which such an anomalous audio presentation occurs 81. In the drawing, 81 points to the point on the graph where the frequency at which the anomalous audio presentation occurs. Once the frequency at which an anomalous presentation occurs is determined, the amplitude of the signal at this frequency is then decreased as shown in 90. Note in the functional representation within the drawing 90 the anomalously high amplitude is reduced, which compensates for anomalies in the audio presentation. Automobiles of the same size, shape, and of the same characteristics, such as cars of the same model, may present the same anomalies. The frequency and amount of adjustment performed, in a further embodiment, may be preset in an equalizer to reduce anomalous responses for future presentation in the listening environment. For example, the frequency and adjustment amount of anomalous responses in a model of an automobile may be preset in an equalizer that is implemented with the cars audio system to compensate for these acoustical anomalies.

Figure 8:
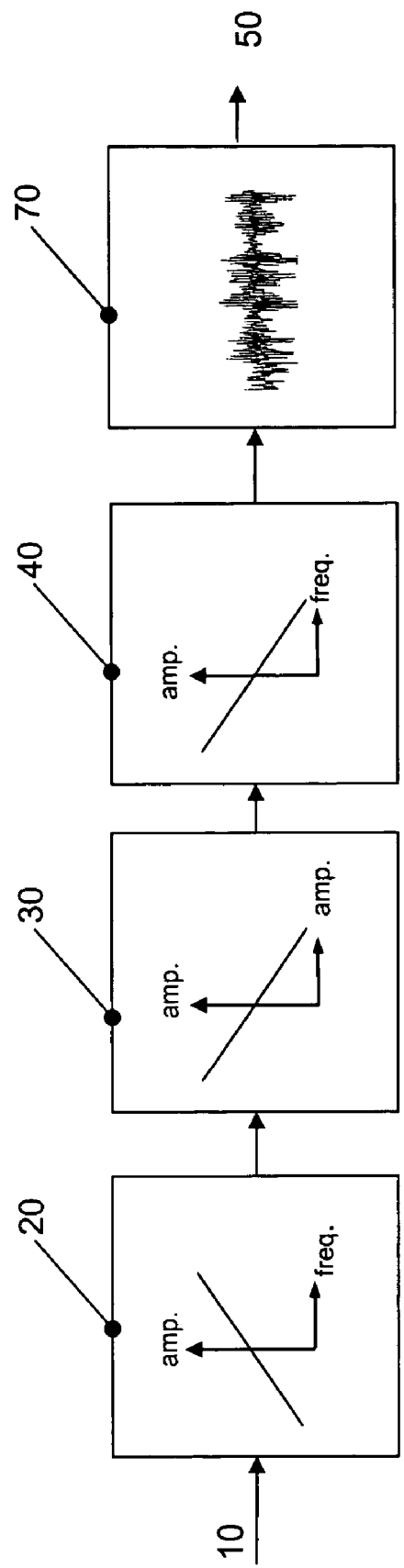
FIG. 8 is a schematic view of an equalizer, compressor, mirror equalizer, and final equalizer coupled together.

FIG. 8 shows the embodiment of the invention shown in FIG. 1 with a final equalizer 70 that adjusts the amplitude of the audio signal at frequencies predetermined to be related to sound presentation anomalies associated with the anticipated listening environment.

Figure 9:
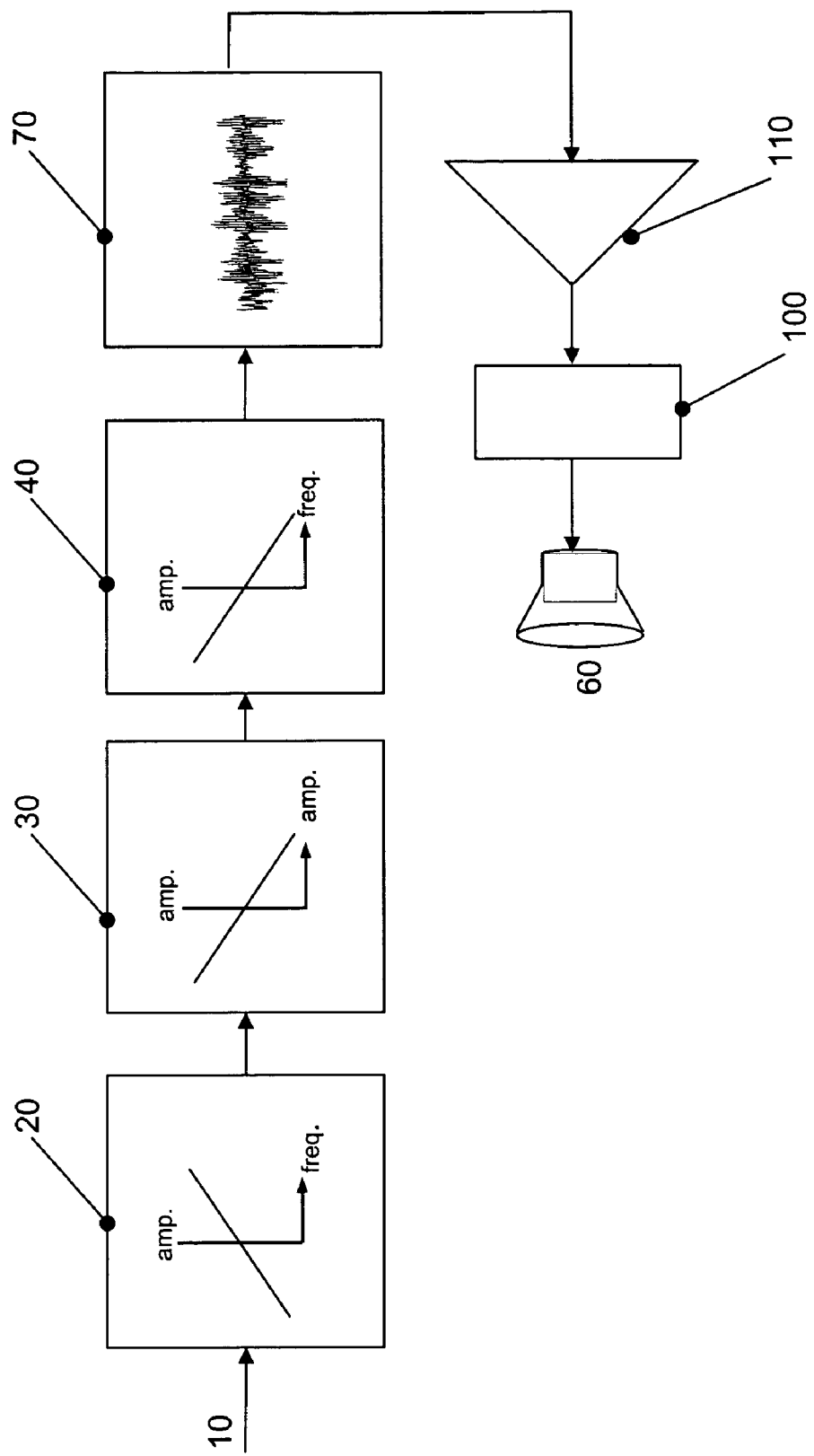
FIG. 9 is a schematic view of an equalizer, compressor, mirror equalizer, final equalizer, amplifier, a multi-band equalizer, and a speaker coupled together.

FIG. 9 illustrates the embodiment of FIG. 8 with an amplifier 110 for audio amplification, a multi-band equalizer 100, for further fine-tuning, and a speaker system 60 for sound presentation.

The embodiments of the present invention are premised on the assumption that most audio transducers are efficient between about 600 Hz and about 1,000 Hz. Furthermore, the human ear is very efficient within this range. Because of these efficiencies, the present invention may do most of its audio processing outside of this range to improve the overall quality of the sound presentation.

One embodiment of the present invention provides for a system for processing an audio signal with a primary equalizer, compressor, and mirror equalizer. The primary equalizer produces an equalized audio signal by adjusting the amplitude of the low frequency portions of an audio signal corresponding to audible bass sounds and adjusting in the opposite direction the amplitude of the high frequency portions of an audio signal corresponding to audible treble sounds. These adjustments occur in a substantially linear function of frequency. The above mentioned adjusting of the low frequency portions of the signal and the adjusting in the opposite direction of the high frequency portion of the signal intersect between a frequency range that produces a substantially negligible gain within this range. The point where these adjustments intersect is the crossover point and produces a gain of zero. The range around this point is the crossover range. For example, this crossover point may occur between about 600 Hz and about 1,000 Hz. An embodiment may further comprise a compressor that produces a compressed audio signal by compressing the dynamic range of the audio signal by attenuating high amplitude signals, amplifying low amplitude signals, or by doing a combination of both. The compressor may compress the dynamic range of the audio signal to less than about 10 db. Finally, a mirror equalizer produces a substantially opposite effect on the audio signal as the primary equalizer. This mirror equalizer has substantially the same crossover point and range as the primary equalizer.

At the crossover point, the effects on the audio signal of the two adjustments, in both the primary and mirror equalizers, exactly cancel each other out and produce a net gain of zero. Centered around this crossover point is the crossover range of frequencies where these two adjustments substantially negate their effect on the audio signal. This crossover range, in one embodiment of the present invention, is between approximately 600 Hz and approximately 1,000 Hz. In this embodiment, the crossover range may be specially designed to be within the efficiency range of standard sound transducers and the human ear. Other embodiments may shift this crossover point as necessitated by the specific application.

In one specific embodiment of the system, the primary equalizer boosts the high frequency portions of an audio signal and attenuates the low frequency portions of an audio signal. The mirror equalizer does the opposite; it attenuates the high frequency portions of an audio signal and boosts the low frequency portions of an audio signal. In each equalizer, at the same frequency between the high frequency boosting and low frequency attenuating and boosting, the effects of the boosting and attenuation intersect at the crossover point.

In another specific embodiment of the system, the primary equalizer attenuates the high frequency portions of an audio signal and boosts the low frequency portions of an audio signal. The mirror equalizer does the opposite; it boosts the high frequency portions of an audio signal and attenuates the low frequency portions of an audio signal.

In yet another specific embodiment of the system, the primary equalizer and mirror equalizer use at least one filter. The equalizers may, for example, use a high-band and a low-band filter. The filter that operates on the high frequency portion of an audio signal in the primary equalizer produces an equal and opposite effect on the audio signal as the filter in the mirror equalizer. That is, for example, if the high frequency filter in the primary equalizer boosts the signal 8 db at 8 kHz, then the high frequency filter in the mirror equalizer attenuates the signal 8 db at 8 kHz. For example, if the high frequency filter in the primary equalizer attenuates the signal 8 db at 8 kHz then the high frequency filter in the mirror equalizer boosts the signal 8 db at 8 kHz. For example, if the low frequency filter in the primary equalizer boosts the signal 10 db at 100 Hz, then the low frequency filter in the mirror equalizer attenuates the signal 10 db at 100 Hz. Finally, for example, if the low frequency filter in the primary equalizer attenuates the signal 10 db at 100 Hz, then the low frequency filter in the mirror equalizer boosts the signal 10 db at 100 Hz. In between these frequencies the filters boost and attenuate at a substantially linear function of frequency.

Another embodiment of the system includes a final equalizer which, after mirror equalization, may adjust the amplitude of the audio signal at frequencies predetermined to be related to sound presentation anomalies associated with the anticipated listening environment. These frequencies have been previously detected to be associated with acoustical anomalies such as standing waves, and accented and absorbed frequencies. The frequency and magnitude of adjustment performed may be preset in this final equalizer to reduce any anomalous responses. Thus, audio signals played through this final equalizer in environments in which the final equalizer was prepared may present music absent anomalies associated with the listening environment.

Another embodiment of the system may present an audio signal after primary equalization, compression, and mirror equalization to an amplifier. The system may also present an audio signal to a multi-band equalizer for fine-tuning. The system may also present an audio signal to a speaker. These three components may be implemented, in any combination with or without each other.

Another embodiment of the present invention is a method for processing an audio signal with a primary equalizing step, a compression step, and a mirror equalizing step. The primary equalizing step produces an equalized audio signal by adjusting the amplitude of the low frequency portions of an audio signal corresponding to audible bass sounds and adjusting in the opposite direction the amplitude of the high frequency portions of an audio signal corresponding to audible treble sounds. These adjustments occur in a substantially linear function of frequency. With this method, the above-mentioned adjusting of the low frequency portions of the signal and the adjusting in the opposite direction of the high frequency portion of the signal intersect between a crossover range that produce a substantially negligible gain within this crossover range. For example, one method may have a crossover range may occur between approximately 600 Hz and approximately 1,000 Hz. This method further comprises a compressing step that produces a compressed audio signal by compressing the dynamic range of the audio signal by attenuating high amplitude signals, amplifying low amplitude signals or by doing a combination of both. The compressing step in this method of one embodiment of the present invention may compress the dynamic range of the audio signal to less than about 10 db. The final step of this method is a mirror equalizing step that produces a substantially opposite effect as the primary equalizing step. This mirror equalizing step has substantially the same crossover range as the primary equalizing step.

In one specific embodiment of the present invention, the primary equalizing step boosts the high frequency portions of an audio signal and attenuates the low frequency portions of an audio signal. The mirror equalizing steps does the opposite; it attenuates the high frequency portions of an audio signal and boosts the low frequency portions of an audio signal. In each equalizing step, at some frequency between the high frequency boosting and low frequency attenuating the effects of the boosting and attenuating intersect at the crossover point and produce a net gain of zero.

In another specific embodiment of the present invention, the primary equalizing step attenuates the high frequency portions of an audio signal and boosts the low frequency portions of an audio signal. The mirror equalizing step does the opposite; it boosts the high frequency portions of an audio signal and attenuates the low frequency portions of an audio signal. This embodiment also has a crossover point and a crossover range that may be chosen according to the specific application.

Another embodiment of the present invention includes a final equalizing step which, after the mirror equalizing step, adjusts the amplitude of the audio signal at frequencies predetermined to be related to sound presentation anomalies associated with the anticipated listening environment. These frequencies have been previously detected to be associated with acoustical anomalies. The frequency and magnitude of the adjustment may be preset in this step to reduce any anomalous responses. Thus, audio signals played through this final equalizing step, in environments in which the final equalizing step was prepared, may present music without anomalies.

The methods of the present invention may be performed by any number of processors. It may be performed by a computer, computer software, electrical circuit, an electrical chip programmed to perform these steps, or any other means to perform the method described.

In one method of the present invention, the primary equalizing and mirror equalizing steps may use at least one filter. The filters that operate in the high frequency portion of the signal in the primary and mirror equalizing steps produce an equal and opposite effect. That is, for example, if the high frequency filter in the primary equalizing step boosts the signal 8 db at 8 kHz then the high frequency filter in the mirror equalizing step attenuates the signal 8 db at 8 kHz. For example, if the high frequency filter in the primary equalizing step attenuates the signal 8 db at 8 kHz then the high frequency filter in the mirror equalizing step boosts the signal 8 db at 8 kHz. For example, if the low frequency filter in the primary equalizing step boosts the signal 10 db at 100 Hz then the low frequency filter in the mirror equalizing step attenuates the signal 10 db at 100 Hz. Finally, for example, if the low frequency filter in the primary equalizing step attenuates the signal 10 db at 100 Hz then the low frequency filter in the mirror equalizing step boosts the signal 10 db at 100 Hz. In between these frequencies, the filters boost and attenuate at substantially linear functions of frequency.

Another embodiment of the present invention provides for a circuit for processing an audio signal comprising a primary equalizer, compressor, and mirror equalizer. The primary equalizer produces an equalized audio signal by adjusting the amplitude of the low frequency portions of an audio signal corresponding to audible bass sounds and adjusting in the opposite direction the amplitude of the high frequency portions of an audio signal corresponding to audible treble sounds. These adjustments occur in a substantially linear function of frequency. In this circuit, the above mentioned adjusting of the low frequency portions of an audio signal and the adjusting in the opposite direction of the high frequency portion of an audio signal intersect between a frequency range that produces a substantially negligible gain within this range. The circuit may further comprise a compressor that produces a compressed audio signal by compressing the dynamic range of the audio signal by attenuating high amplitude signals, amplifying low amplitude signals or by doing a combination of both. The compressor in this circuit may, for example, compress the dynamic range of the audio signal to less than about 10 db. Finally, the circuit of this embodiment includes a mirror equalizer that produces a substantially opposite effect as the primary equalizer and has substantially the same crossover range as the primary equalizer.

The primary and mirror equalizers, in this circuit have a matched crossover point and a matched crossover range. At this crossover point the effect of these two adjustments on the audio signal exactly cancel each other out and produce a net gain of zero. Centered around this crossover point is the crossover range. This crossover range, in one embodiment of the present invention, is between approximately 600 Hz and approximately 1,000 Hz. In this embodiment, the crossover range is specially designed to be within the efficiency range of standard sound transducers and the human ear. Other embodiments may shift this crossover point as necessitated by the specific application.

In one specific embodiment of the present invention, the primary equalizer boosts the high frequency portions of an audio signal and attenuates the low frequency portions of an audio signal. The mirror equalizer does the opposite; it attenuates the high frequency portions of an audio signal and boosts the low frequency portions of an audio signal. In each equalizer, at some frequency between the high frequency boosting and low frequency attenuating and boosting the affects of the boosting and attenuation intersect at the crossover point.

In another specific embodiment of the present invention, the primary equalizer attenuates the high frequency portions of an audio signal and boosts the low frequency portions of an audio signal. The mirror equalizer does the opposite; it boosts the high frequency portions of an audio signal and attenuates the low frequency portions of an audio signal. In each equalizer, at some frequency between the high frequency boosting or attenuating and low frequency attenuating or boosting the two processes intersect at the crossover point.

The circuit of the present invention may include a final equalizer which, after mirror equalization, adjusts the amplitude of the audio signal at frequencies predetermined to be related to sound presentation anomalies associated with the anticipated listening environment. These frequencies have been previously detected to be associated with acoustical anomalies and hard programmed into this circuit. The frequency and amount of adjustment performed may be preset in this final equalizer to reduce any anomalous responses. Thus, audio signals played through this final equalizer may present music absent anomalies associated with the listening environment in environments in which the final equalizer was prepared.

The circuit of this embodiment of the present invention may be implemented in a digital circuit, an analog circuit, or any combination of both. Any part of this circuit, equalizers or compressors, may individually be digital or analog, and may be coupled together. Those working in the art know various compressor and equalizer circuitry that may be implemented to produce the claimed results.

In the circuit of the present invention, the primary equalizer and mirror equalizer may use at least one filter. The filter that operates on the high frequency portion of the signal in the primary and mirror equalizers produce an equal and opposite effect. That is, for example, if the high frequency filter in the primary equalizer boosts the signal 8 db at 8 kHz then the high frequency filter in the mirror equalizer attenuates the signal 8 db at 8 kHz. For example, if the high frequency filter in the primary equalizer attenuates the signal 8 db at 8 kHz then the high frequency filter in the mirror equalizer boosts the signal 8 db at 8 kHz. For example, if the low frequency filter in the primary equalizer boosts the signal 10 db at 100 Hz then the low frequency filter in the mirror equalizer attenuates the signal 10 db at 100 Hz. Finally, for example, if the low frequency filter in the primary equalizer attenuates the signal 10 db at 100 Hz, then the low frequency filter in the mirror equalizer boosts the signal 10 db at 100 Hz. In between these frequencies the filters boost and attenuate at substantially linear functions of frequency.

In another embodiment of the present invention this circuit may present an audio signal after primary equalization, compression, and mirror equalization to an amplifier. The circuit may also present an audio signal to a multi-phase equalizer for fine-tuning. The system may also present an audio signal to a speaker. These three components may be implemented in any combination, with or without each other.

A further embodiment of the present invention is the method of hard-programming adjustments into a multi-band equalizer that compensates for anomalies associated with the anticipated listening environment. This method includes a number of steps. The first step is presenting a test audio signal into an anticipated listening environment. This test audio signal may be broadband noise, frequency sweeps, or any other test signal known in the art. The test audio signal may be music that is well known and exhibits an understood response. The next step in the method is detecting audio presentation anomalies associated with the anticipated listening environment from responses from the test audio signal. This step may be performed with a fast Fourier analyzer, a computer frequency analyzer, or any other system that analyzes the amplitude response of an audio signal over a broad range of frequencies. By analyzing the response returned by the listening environment, one may determine the frequencies where standing waves occur in the environment, frequencies that are accented by the environment, frequencies that are absorbed by the environment, or any other type of anomalous response due to the presentation environment. Once the frequencies of the anomaly and the magnitude of the anomaly are known, a multi-band equalizer may be adjusted to compensate for these anomalies. Finally, the magnitude of these adjustments at these set frequencies may be hard-programmed into a multi-band equalizer or a set of multi-band equalizers. Hard-programming sets the values so they are unchangeable by a future user. These values may be stored in some storage device or physically set. Thus, by using this multi-band equalizer in a system used in the anticipated listening environment or a reasonably similar environment, one may present music free from environmental anomalies.

For example, one specific embodiment of the present invention comprises developing a multi-band equalizer that is hard-programmed with adjustments that compensate for anomalies associated with one model of automobile. Each car of the same model likely presents very similar listening anomalies due to their similar size, shape, structural make-up, speaker placement, speaker quality, and speaker size. While inside one model of the car, a user may implement the method of this embodiment by playing a test signal through the cars sound system. While this test signal is playing a computer with frequency response software and hardware, such as a fast Fourier analyzing software, may detect anomalous responses by the environment to the test signal. The system may detect standing waves that occur do to the small size of the car, it may detect frequencies that are accented or absorbed by the material in the car, or it may detect diffraction affects from the shape of the car. Once these anomalies are detected, the frequency and magnitude of the anomalies are noted and adjustments of the proper magnitude are made in a multi-band equalizer at those frequencies. This method may be repeated until environment related anomalies are reasonably adjusted for. The magnitude of the adjustments at each frequency is noted along with the frequency. These values are then hard programmed into equalizers and implemented in an audio system of cars of the same model. By following this method each car may ultimately have an audio system that presents anomalous free sound.

It is to be understood that the above described embodiments are illustrative of only a few of the many possible specific embodiments which can represent applications of the principles of the invention. Numerous and various other possibilities for use of the present invention will be obvious to those skilled in the art without departing from the spirit and scope of the invention.

What is claimed is:

1. A system for processing an audio signal comprising:
a primary equalizer that produces an equalized audio signal by adjusting the amplitude of the low frequency portions of said audio signal corresponding to audible bass sounds and adjusting in the opposite direction the amplitude of the high frequency portions of said audio signal corresponding to audible treble sounds, wherein said adjusting and said adjusting in the opposite direction intersect between a crossover range of frequencies producing a substantially negligible gain in said crossover range;
a compressor that produces a compressed audio signal by compressing the dynamic range of said audio signal; and
a mirror equalizer that produces a substantially opposite effect as said primary equalizer,
wherein said audio signal is used as both a source and control for the compressor, and
wherein said compressor compresses said audio signal by attenuating the high amplitude portions of said audio signal and amplifying the low amplitude portions of said audio signal.

2. The system of claim 1, wherein said crossover range is approximately 600 Hz to approximately 1,000 Hz.

3. The system of claim 1, wherein said primary equalizer and said mirror equalizer adjust amplitude according to a substantially linear function of frequency.

4. The system of claim 1, wherein said primary equalizer uses at least one filter to adjust the amplitude of said high frequency portions of said audio signal and said mirror equalizer also uses at least one filter to produce a substantially opposite effect on said high frequency portions of said audio signal as said primary equalizer; wherein said filters have a substantially equal and opposite effect on said audio signal.

5. The system of claim 1, wherein said primary equalizer uses at least one filter to adjust the amplitude of said low frequency portions of said audio signal and said mirror equalizer also uses at least one filter to produce a substantially opposite effect on said low frequency portions of said audio signal as said primary equalizer; wherein said filters have an equal and opposite effect on said audio signal.

6. The system of claim 1 further comprising a speaker system responsive to said output signal of said mirror equalizing.

7. The system of claim 1, wherein said compressor compresses the dynamic range of said audio signal to less than about 10 dB.

8. The system of claim 1, wherein said primary equalizer decreases the amplitude of said low frequency portions of said signal by about 10 dB at 100 Hz.

9. The system of claim 1, wherein said primary equalizer increases the amplitude of said high frequency portions of said signal by about 8 dB at 8 kHz.

10. The system of claim 1, wherein said mirror equalizer increases the amplitude of said low frequency portions of said signal by about 10 dB at 100 Hz.

11. The system of claim 1, wherein said mirror equalizer decreases the amplitude of said high frequency portions of said signal by about 8 dB at 8 kHz.

12. The system of claim 1, wherein said primary equalizer increases the amplitude of said low frequency portions of said signal by about 10 dB at 100 Hz.

13. The system of claim 1, wherein said primary equalizer decreases the amplitude of said high frequency portions of said signal by about 8 dB at 8 kHz.

14. The system of claim 1, wherein said mirror equalizer decreases the amplitude of said low frequency portions of said signal by about 10 dB at 100 Hz.

15. The system of claim 1, wherein said mirror equalizer increases the amplitude of said high frequency portions of said signal by about 8 dB at 8 kHz.

16. A system for processing an audio signal comprising:
a primary equalizer that produces an equalized audio signal by decreasing the amplitude of the low frequency portions of said audio signal corresponding to audible bass sounds and increasing the amplitude of the high frequency portions of said audio signal corresponding to audible treble sounds, wherein said decreasing and said increasing intersect between a frequency range producing a substantially negligible gain in said range; and
a compressor that produces a compressed audio signal by compressing the dynamic range of said audio signal; and
a mirror equalizer that produces a substantially opposite effect as said primary equalizer,
wherein said audio signal is used as both a source and control for the compressor, and
wherein said compressor compresses said audio signal by attenuating the high amplitude portions of said audio signal and amplifying the low amplitude portions of said audio signal.

17. A system for processing an audio signal comprising:
a primary equalizer that produces an equalized audio signal by adjusting the amplitude of the low frequency portions of said audio signal corresponding to audible bass sounds and adjusting in the opposite direction the amplitude of the high frequency portions of said audio signal corresponding to audible treble sounds, wherein said adjusting and said adjusting in the opposite direction intersect between a frequency range producing a substantially negligible gain in said range;
a compressor that produces a compressed audio signal by compressing the dynamic range of said audio signal;
a mirror equalizer that produces a substantially opposite effect as said primary equalizer; and
a final equalizer that adjusts the amplitude of said signal at frequencies predetermined to be related to sound presentation anomalies associated with the anticipated listening environment,
wherein said audio signal is used as both a source and control for the compressor, and
wherein said compressor compresses said audio signal by attenuating the high amplitude portions of said audio signal and amplifying the low amplitude portions of said audio signal.

18. A system for processing an audio signal comprising:
a primary equalizer that produces an equalized audio signal by decreasing the amplitude of the low frequency portions of said audio signal corresponding to audible bass sounds and increasing the amplitude of the high frequency portions of said audio signal corresponding to audible treble sounds, wherein said decreasing and said increasing intersect between a frequency range producing a substantially negligible gain in said range; and
a compressor that produces a compressed audio signal by compressing the dynamic range of said audio signal;
a mirror equalizer that produces a substantially opposite effect as said primary equalizer; and
a final equalizer that adjusts the amplitude of said signal at frequencies predetermined to be related to sound presentation anomalies associated with the anticipated listening environment,
wherein said audio signal is used as both a source and control for the compressor, and
wherein said compressor compresses said audio signal by attenuating the high amplitude portions of said audio signal and amplifying the low amplitude portions of said audio signal.

19. A method for processing an audio signal comprising the steps of:
primary equalizing said audio signal by adjusting the amplitude of the low frequency portions of said audio signal corresponding to audible bass sounds and adjusting in the opposite direction the amplitude of the high frequency portions of said audio signal corresponding to audible treble sounds, wherein said adjusting and said adjusting in the opposite direction intersect between a frequency range producing a substantially negligible gain in said range;
compressing the dynamic range of said audio signal; and
mirror equalizing said audio signal in a substantially opposite way as said primary equalizing,
wherein said compressing of said audio signal attenuates the high amplitude portions of said audio signal and amplifies the low amplitude portions of said audio signal.

20. A method for processing an audio signal comprising the steps of:
primary equalizing said audio signal by adjusting the amplitude of the low frequency portions of said audio signal corresponding to audible bass sounds and adjusting in the opposite direction the amplitude of the high frequency portions of said audio signal corresponding to audible treble sounds, wherein said adjusting and said adjusting in the opposite direction intersect between a frequency range producing a substantially negligible gain in said range;
compressing the dynamic range of said audio signal;
mirror equalizing said audio signal in a substantially opposite way as said primary equalizing; and
adjusting the amplitude of said signal at frequencies predetermined to be related to sound presentation anomalies associated with the anticipated listening environment,
wherein said compressing of said audio signal attenuates the high amplitude portions of said audio signal and amplifies the low amplitude portions of said audio signal.

21. A circuit for processing an audio signal comprising:
a primary equalizer that produces an equalized audio signal by adjusting the amplitude of the low frequency portions of said audio signal corresponding to audible bass sounds and adjusting in the opposite direction the amplitude of the high frequency portions of said audio signal corresponding to audible treble sounds, wherein said adjusting and said adjusting in the opposite direction intersect between a frequency range producing a substantially negligible gain in said range;

a compressor that produces a compressed audio signal by compressing the dynamic range of said audio signal; and a mirror equalizer that produces a substantially opposite effect as said primary equalizer, wherein said audio signal is used as both a source and control for the compressor, and wherein said compressor compresses said audio signal by attenuating the high amplitude portions of said audio signal and amplifying the low amplitude portions of said audio signal.

22. A circuit for processing an audio signal comprising:

a primary equalizer that produces an equalized audio signal by adjusting the amplitude of the low frequency portions of said audio signal corresponding to audible bass sounds and adjusting in the opposite direction the amplitude of the high frequency portions of said audio signal corresponding to audible treble sounds, wherein said adjusting and said adjusting in the opposite direction intersect between a frequency range producing a substantially negligible gain in said range;

a compressor that produces a compressed audio signal by compressing the dynamic range of said audio signal;

a mirror equalizer that produces a substantially opposite effect as said primary equalizer; and a final equalizer that adjusts the amplitude of said signal at frequencies predetermined to be related to sound presentation anomalies associated with the anticipated listening environment, wherein said audio signal is used as both a source and control for the compressor, and wherein said compressor compresses said audio signal by attenuating the high amplitude portions of said audio signal and amplifying the low amplitude portions of said audio signal.

* * * * *